United States Patent
Martin et al.

(10) Patent No.: US 6,632,689 B2
(45) Date of Patent: Oct. 14, 2003

(54) METHOD FOR PROCESSING SEMICONDUCTOR WAFERS IN AN ENCLOSURE WITH A TREATED INTERIOR SURFACE

(75) Inventors: Richard E. Martin, Leander, TX (US); Dean J. Denning, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/060,539

(22) Filed: Jan. 30, 2002

(65) Prior Publication Data

US 2003/0143820 A1 Jul. 31, 2003

(51) Int. Cl.[7] .............................................. H01L 21/66
(52) U.S. Cl. ......................................................... 438/14
(58) Field of Search .................... 438/905, 14

(56) References Cited

U.S. PATENT DOCUMENTS

| 5,569,423 A | 10/1996 | Belunova et al. |
| 5,807,416 A | * 9/1998 | Kemmochi et al. .......... 65/32.4 |
| 5,976,900 A | * 11/1999 | Qiao et al. ..................... 438/14 |

* cited by examiner

*Primary Examiner*—David Nelms
*Assistant Examiner*—Quoc Hoang
(74) *Attorney, Agent, or Firm*—Robert L. King; James L. Clingan, Jr.

(57) ABSTRACT

A process for manufacturing semiconductors uses an enclosure (22) having an interior surface-that is intentionally-roughened by spraying quartz (44) onto the interior surface. The sprayed quartz (44) creates additional surface area for the purpose of trapping or capturing etched material in the enclosure during the process. The roughness of the interior surface is not significantly reduced during the semiconductor processing so that only chemical cleaning is required to maintain the interior surface for long-term use.

28 Claims, 2 Drawing Sheets

US 6,632,689 B2

METHOD FOR PROCESSING SEMICONDUCTOR WAFERS IN AN ENCLOSURE WITH A TREATED INTERIOR SURFACE

FIELD OF THE INVENTION

This invention relates generally to semiconductor processing, and more specifically, to enclosures and associated parts used in the processing of semiconductors.

BACKGROUND OF THE INVENTION

Semiconductor wafers are processed in various chambers that are elevated to predetermined temperatures and pressures. For example, commonly used chambers in processing are physical vapor deposition (PVD) chambers, chemical vapor deposition (CVD) chambers and etch chambers (PECVD). Such chambers typically use quartz, $SiO_2$. For some applications, the interior surface of a quartz enclosure may be desired to be rough depending upon the type of processing that is occurring. Examples where a rough surface is desired include an RF (radio frequency) pre-clean chamber and an plasma enhanced CVD chamber. The rough surface is desired because deposition materials are applied to the inside surface of the enclosure. A rough surface provides more surface area to allow a deposition material to better adhere as compared to a smooth surface.

One known technique for roughening the surface of an RF pre-clean chamber enclosure is to use grit blasting wherein silica or ceramic beads are directed to the surface to create pits. The resulting surface appears pitted. After the grit blasting, a cleaning step of the surface is required to remove the silica that has remained on the surface. Unfortunately not all of the silica is removable as the force of impact lodges silica particles into the interior surface of the enclosure. After the cleaning step, the enclosure is installed and the deposition film is applied to seal the silica to prevent the silica from being deposited during the subsequent processing. However, when subjected to a high temperature and high pressure environment as well as certain electrical and chemical reactions, the deposition film begins to wear and flake off. The flakes as well as the silica fall onto a wafer being processed within the enclosure and result in killer defects and reduced die yield.

Additionally, prior to the deposition film and silica beginning to flake off and cause defects, the enclosure must be removed from productive activity and again subjected to a grit blasting technique. Another chemical cleaning is required prior to re-installing and forming another sealing film. Thus in known semiconductor processing lines, enclosure surfaces of some chambers typically are a source of processing defects, must be removed periodically from productive operation, and require significant continual maintenance expense.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
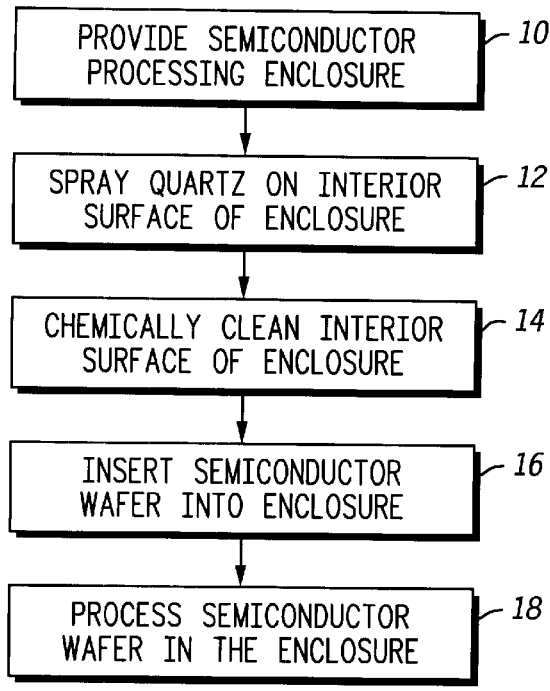
FIG. 1 illustrates in flow diagram form a semiconductor process in accordance with the present invention.

Illustrated in FIG. 1 is a process for processing a semiconductor device in accordance with the present invention. In a step 10, a semiconductor processing enclosure is provided. It should be understood that the enclosure may be either a chamber, a dome or a tube used to handle or process a semiconductor wafer. In a step 12, quartz, $SiO_2$, is physically sprayed onto an interior surface of the enclosure. In a step 14, an interior surface of the enclosure is chemically cleaned. As an example, a chemical bath having a solution of a wet acid such as diluted hydrofluoric (HF) acid may be used. After the chemical cleaning, in a step 16 the semiconductor wafer is inserted into the enclosure. In a step 18, the semiconductor wafer is processed in the enclosure. As an example, the wafer may sputtered cleaned by using Argon (Ar) or Oxygen ($O_2$) sputtered. Various additional semiconductor process steps may be implemented, such as depositing material on the wafer by using CVD (including LPCVD and APCVD), PVD and epitaxial deposition. Some etching steps, such as PECVD, may also be implemented using a quartz enclosure. Additionally, temperature treatment processing, such as Rapid Thermal Anneal (RTA) and Rapid Thermal Process (RTP), may be subsequently used. The surface roughness of the quartz surface prior to step 12 is typically in the range of 150 nm or 150 RMS (root mean square). After step 12, the surface roughness is typically in the range of at least about 500 nm or greater. However, the roughness may be less than 500 nm depending upon the particular semiconductor processing application. This process may be used on any surface of an enclosure that requires grit blasting or bead blasting in lieu of the grit blasting or bead blasting.

Figure 2:
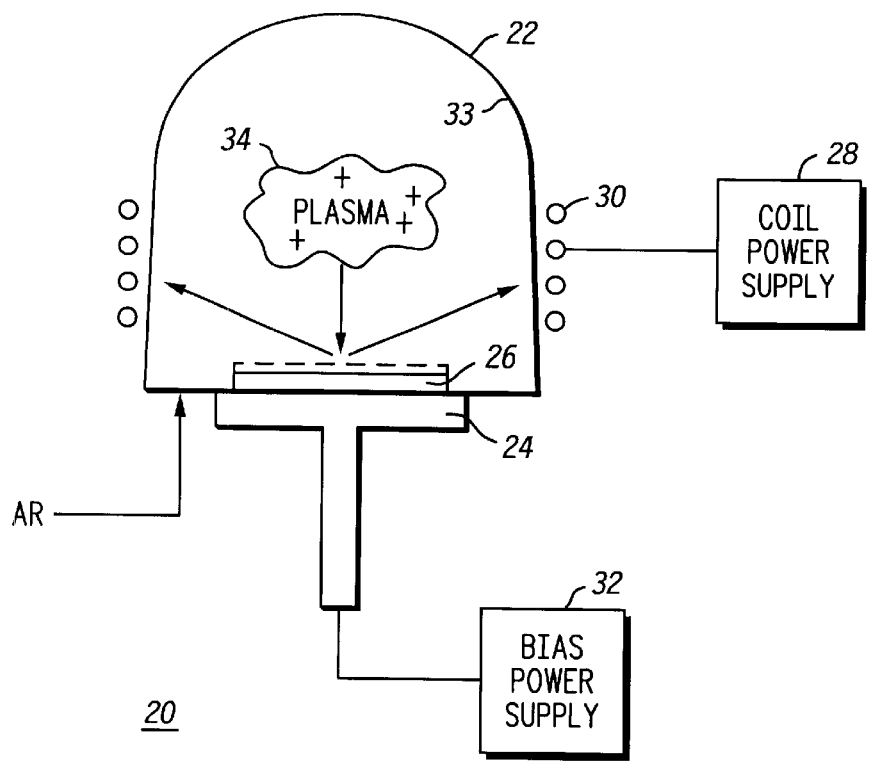
FIG. 2 illustrates a perspective view of a semiconductor process chamber in accordance with the present invention.

Illustrated in FIG. 2 is a semiconductor processing system 20 having a quartz enclosure 22 for processing semiconductors. In the illustrated form, enclosure 22 is a dome but may be implemented as any type of container such as a quartz tube. Although quartz is the preferred material for the enclosure 22, it should be appreciated that other materials may be used for the enclosure 22. For example, various glass-like materials may be utilized. Enclosure 22 has an interior surface 33. Contained within enclosure 22 adjacent an opening of a bottom surface of the enclosure 22 is a semiconductor wafer 26. The semiconductor wafer 26 is supported by a wafer pedestal 24. A coil power supply 28 is connected to a coil 30 that surround an external surface of enclosure 22 above semiconductor wafer 26. A bias power supply 32 is connected to pedestal 24. Additionally, a supply of Argon gas is connected to an opening of the enclosure 22.

In operation, enclosure 22 contains a roughened interior surface in accordance with the present invention. When coil power supply 28 and bias power supply 32 are activated, the surface of the semiconductor wafer 26 develops a source of negatively charged ions on an upper surface thereof. The coils 30 develop an electric field around the enclosure 22 that positively charges the Argon molecules to create plasma 34. As a sufficient charge differential is created, the positively charged Argon molecules bombard the negatively charged upper surface of the semiconductor wafer 26. As the Argon molecules hit the semiconductor. wafer 26, material is sputtered or removed from the upper surface of semiconductor wafer 26 as noted by the arrows directed away from the surface of the semiconductor wafer 26. The sputtered material hits the roughened interior surface of the quartz enclosure 22. Upon hitting the interior surface of the quartz enclosure 22, recombination of atoms occurs and the atoms are mechanically trapped onto the sides of quartz enclosure 22. After a. predetermined build-up of material onto the sides of quartz enclosure 22, a chemical cleaning of the interior quartz enclosure 22 is required. We have noticed that when the interior surface of the quartz enclosure is roughened as taught herein, negligible wear of the interior surface roughness occurs. In contrast, in prior roughening techniques that used bead blasting or grit blasting to create a rough interior surface, at this point additional blasting would be required as significant wear to the roughness was observed. After chemical cleaning has occurred, the interior surface may be immediately used without further processing as the roughened quartz interior surface remains rough and needs no further processing.

Figure 3:
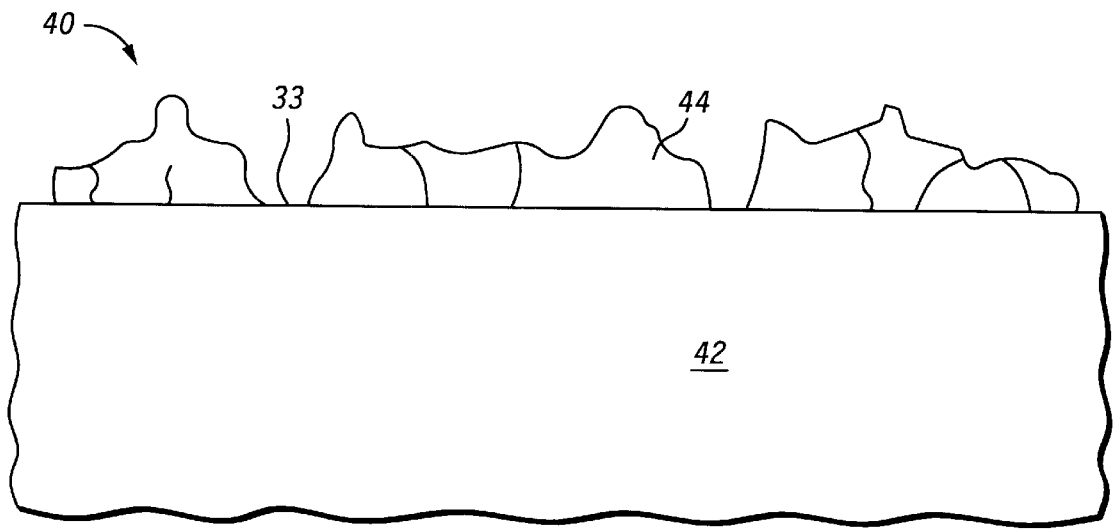
FIG. 3 illustrates in cross-sectional form an interior surface of a semiconductor processing enclosure in accordance with the present invention.

Illustrated in FIG. 3 is a cross-sectional view 40 of a quartz body 42 having a roughened interior surface. Elements common between FIG. 3 and FIG. 2 are given the same reference number for purposes of convenience of understanding. A quartz layer 44 is illustrated having been sprayed onto the interior quartz surface. Quartz layer 44 functions as a coating material that coats quartz body 42. Molten quartz may be sprayed onto a quartz surface using a spraying apparatus. The resulting quartz layer 44 has a very uneven and crystalline structure that creates numerous additional surface edges and pockets that will enhance mechanical trapping of redeposited material, such as material reflected from a semiconductor wafer during ion bombardment, for example. It should be noted that the sprayed quartz results in no loose pieces and also the shape and density of the quartz coating can be optimized for a specific container. A molten quartz spray is a very clean and glazed process. Interior surface 33 is exposed in those portions where the quartz layer 44 is not present on the quartz body 42. In generally, quartz layer 44 may also be implemented by materials other than quartz wherein the material contains silicon, oxygen and an element different from silicon and oxygen.

Figure 4:
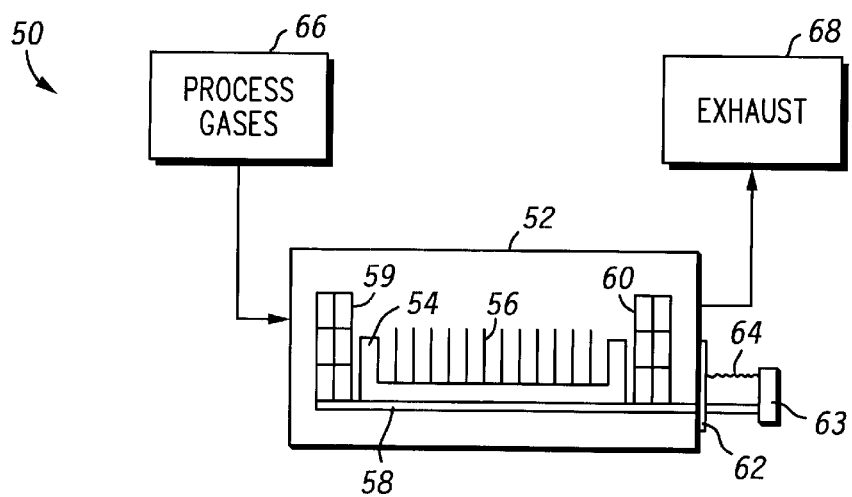
FIG. 4 illustrates in perspective form a semiconductor horizontal CVD furnace.

Illustrated in FIG. 4 is a horizontal CVD furnace 50 used in a CVD (chemical vapor deposition) process in the manufacture of semiconductors. A container 52 houses a quartz wafer holding boat 54 that contains a plurality of semiconductor wafers, such as wafer 56. The quartz wafer holding boat 54 is positioned on a cantilever 58. Positioned on the cantilever 58 at either end of the quartz wafer holding boat 54 are quartz baffles 59 and 60. Quartz wafer holding boat 54 is inserted into container 52 via a door 62. The cantilever 58 extends in the container 52 through door 62. Gear box 63 drives a worm drive 64 that functions to insert and remove the quartz wafer holding boat 54 from container 52. A process gas tank 66 is connected to container 52 for providing process gases. An exhaust vent is connected to an exhaust tank 68 for holding exhaust gases.

In operation, it is desired that quartz wafer holding boat 54 and baffles 59 and 60 have exterior surfaces thereof roughened to provide more surface area for trapping particles that are deposited on the wafers in the quartz wafer holding boat 54. The roughened surfaces function as an assist mechanism to assist in the processing of the plurality of wafers. It should be understood that quartz baffles 59, 60 and quartz wafer holding boat 54 may be formed of other materials, such as any quartz-like material having silicon, oxygen and an element different from silicon and oxygen. Again, in one form, a roughness in the range of 150 nm to 500 nm or greater may be used. Significant maintenance cost savings and yield enhancement are obtained by using the surface roughening process to enhance wafer holding boat 54 and baffles 59 and 60.

By now it should be appreciated that there has been provided a semiconductor manufacturing process related to the treating of an inside surface of a container used in the process. By spraying a glass layer or molten quartz onto a glass enclosure or a quartz enclosure to create higher surface area without the need to grit blast or bead blast silica, reduced down time of the equipment for container conditioning is required. The sprayed-on layer of quartz is an inexpensive manufacturing step compared to the savings realized by its benefits. An increase in the enclosure's use is derived as well as obtaining cleaner in-film processing having fewer defects. The surface roughness process taught herein increases production time and reduces maintenance costs when manufacturing semiconductors.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, an interior surface of any type of container may be roughened in lieu of grit blasting. In addition to spraying quartz, other materials such as a transparent plasma be used. Various processing of a wafer in a semiconductor may be performed using the present invention, such as sputter cleaning a semiconductor wafer. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed:

1. A method for processing a semiconductor wafer, comprising:

providing an enclosure having an interior surface of quartz;

spraying quartz on the interior surface;

inserting the semiconductor wafer in the enclosure adjacent a baffle having a roughened surface; and processing the semiconductor wafer in the enclosure.

2. The method of claim 1, wherein the spraying of quartz results in a quartz layer having a roughness of at least about 500 nanometers RMS.

3. The method of claim 1, further comprising chemically cleaning the interior surface of the enclosure after spraying quartz on the interior surface.

4. The method of claim 1, wherein the step of processing comprises sputter cleaning the semiconductor wafer.

5. The method of claim 1, wherein the step of processing causes a deposition of material on the interior surface of the enclosure.

6. The method of claim 5, further comprising removing the material from the interior surface of the enclosure.

7. The method of claim 6, wherein the step of removing comprises applying a wet acid to the interior surface.

8. The method of claim 6, further comprising:

inserting a second semiconductor wafer in the enclosure after the step of removing; and processing the second semiconductor wafer in the enclosure.

9. A method for processing a semiconductor wafer, comprising:

providing an enclosure of quartz-like material having an interior surface, a sprayed quartz layer of coating material on the interior surface that adheres to the quartz-like material, and a surface roughness of at least about 500 nanometers RMS;

inserting the semiconductor wafer in the enclosure; and processing the semiconductor wafer in the enclosure.

10. The method of claim 9, wherein the quartz-like material is quartz.

11. The method of claim 9, wherein the quartz-like material comprises silicon, oxygen, and a first element different from silicon and oxygen.

12. The method of claim 9, further comprising providing a baffle adjacent the semiconductor wafer in the enclosure for providing additional surface area to trap particles that are deposited on the semiconductor wafer.

13. The method of claim 9, wherein the step of processing comprises Argon sputtering the semiconductor wafer.

14. The method of claim 9, wherein the step of processing comprises depositing material on the semiconductor wafer.

15. The method of claim 9, wherein the step of processing comprises etching material off the semiconductor wafer.

16. The method of claim 9, wherein the enclosure is dome-shaped.

17. The method of claim 9, wherein the enclosure is tube-shaped.

18. The method of claim 9, wherein the step of processing results in depositing material on the interior surface of the enclosure.

19. The method of claim 18, further comprising removing the material from the interior surface of the enclosure.

20. The method of claim 19, wherein the step of removing comprises applying a wet acid to the material.

21. The method of claim 20, further comprising:

inserting a second semiconductor wafer in the enclosure after the step of removing; and processing the second semiconductor wafer in the enclosure.

22. A method, comprising:

providing a glass enclosure having an interior surface;

spraying quartz onto the interior surface to achieve a surface roughness of at least about 500 nanometers RMS; inserting a first baffle into the glass enclosure, the first baffle having a first quartz surface with a roughness of at least about 500 nanometers RMS;

placing a first plurality of wafers on a quartz wafer holding boat, the quartz wafer holding boat having a second quartz surface with a roughness of at least about 500 nanometers RMS;

inserting the quartz boat into the glass enclosure and processing the first plurality of wafers and depositing a first layer of material on the quartz during processing of the first plurality of wafers;

removing the first layer of material from the quartz without removing the quartz;

inserting and processing a second plurality of wafers and depositing a second layer of material on the quartz during processing of the second plurality of wafers; and removing the second layer of material from the quartz without removing the quartz.

23. The method of claim 22, wherein the glass enclosure comprise a quartz enclosure.

24. A method, comprising:

providing an enclosure having an interior surface;

spraying quartz on the interior surface of the enclosure to have a surface roughness of at least about 500 nanometers RMS;

providing a quartz baffle;

providing a quartz wafer holding boat;

spraying quartz on the quartz wafer holding boat;

placing a wafer in the quartz wafer holding boat;

inserting the quartz wafer holding boat into the enclosure;

inserting the quartz baffle into the enclosure at one end of the quartz wafer holding boat; and processing the wafer in the enclosure.

25. A method for processing a semiconductor wafer, comprising:

providing an enclosure having an interior surface;

spraying quartz on the interior surface of the enclosure;

providing a quartz baffle having an exterior surface that has a surface roughness of at least about 500 nanometers RMS;

inserting the semiconductor wafer and the quartz baffle in the enclosure; and processing the semiconductor wafer in the enclosure.

26. The method of claim 25 further comprising inserting the semiconductor wafer in the enclosure while in a quartz wafer holding boat.

27. The method of claim 25 further comprising inserting a pair of quartz baffles in the enclosure.

28. The method of claim 25, wherein the step of inserting comprises inserting the quartz baffle into the enclosure prior to inserting the semiconductor wafer.

* * * * *